United States Patent [19]

Kukanskis et al.

[11] Patent Number: 5,674,372

[45] Date of Patent: Oct. 7, 1997

[54] PROCESS FOR PREPARING A NON-CONDUCTIVE SUBSTRATE FOR ELECTROPLATING

[75] Inventors: Peter Kukanskis, Woodbury; Kathleen Yocis, Monroe; Christopher Larson, Cheshire, all of Conn.

[73] Assignee: Mac Dermid, Incorporated, Waterbury, Conn.

[21] Appl. No.: 710,977

[22] Filed: Sep. 24, 1996

[51] Int. Cl.⁶ ........................................ C25D 5/02
[52] U.S. Cl. ............................ 205/118; 205/125
[58] Field of Search ............................ 205/118, 125

[56] References Cited

U.S. PATENT DOCUMENTS

| | | | |
|---|---|---|---|
| 409,096 | 8/1889 | Blank | 205/159 |
| 1,037,469 | 9/1912 | Goldberg | 427/123 |
| 1,352,331 | 9/1920 | Unno | 205/159 |
| 2,243,429 | 5/1941 | Laux | 204/30 |
| 3,099,608 | 7/1963 | Radousky | 204/15 |
| 3,163,588 | 12/1964 | Shortt et al. | 204/16 |
| 4,041,347 | 8/1977 | Deal et al. | 313/450 |
| 4,379,762 | 4/1983 | Chiyoda et al. | 252/507 |
| 4,718,993 | 1/1988 | Cupta et al. | 204/15 |
| 4,724,005 | 2/1988 | Minten et al. | 106/307 |
| 4,888,134 | 12/1989 | Kleitz et al. | 252/511 |
| 4,964,959 | 10/1990 | Nelsen et al. | 205/125 |
| 5,015,339 | 5/1991 | Pendleton | 205/125 |
| 5,139,642 | 8/1992 | Randolph | 205/125 |
| 5,234,627 | 8/1993 | Damschroeder | 252/502 |
| 5,389,270 | 2/1995 | Thorn et al. | 252/22 |

*Primary Examiner*—Kathryn L. Gorgos
*Assistant Examiner*—Edna Wong
*Attorney, Agent, or Firm*—John L. Cordani

[57] ABSTRACT

A process is disclosed for the direct electroplating of a non-conductive material comprising non-conductive surfaces and metallic surfaces. The process involves contacting the non-conductive material with a compound capable of selectively forming a sacrificial layer on the metallic surfaces which sacrificial layer is substantially insoluble in alkaline or neutral media but soluble in acidic media. The foregoing step is followed by deposition of carbon onto the surfaces followed by contact with an acidic solution and subsequent electroplating.

16 Claims, No Drawings

PROCESS FOR PREPARING A NON-CONDUCTIVE SUBSTRATE FOR ELECTROPLATING

BACKGROUND OF THE INVENTION

The present invention relates to a process for enhancing the electroplating of non-conductive surfaces, such as the through holes of a printed circuit board (PCB). The inventive process includes treatment of surfaces, comprising metallic (conductive) surfaces and non-conductive surfaces, with a compound, which is alkaline insoluble but acid soluble on a metallic surface followed by depositing on the surfaces a layer of carbon (e.g. graphite, carbon black or some other intermediate carbon structure) followed by treatment of the surfaces in an acidic solution to remove the carbon from the metallic surfaces and subsequently plating the surfaces. It has been found that the practice of this invention eliminates the need for electroless plating of the non-conductive surface, while also eliminating the need for microetching metallic surfaces between the carbon application and the electroplating process.

Printed circuit boards are generally composed of a non-conductive layer, such as an epoxy resin/glass fiber mixture, which is positioned between copper or nickel plates or foils, or other conductive metal layers. There can also be a multiplicity of these alternating layers. Commonly, holes are drilled through the PCB to establish a connection between the conductive metal layers at specific points in the board. The holes are then metallized to form a connection between the conductive materials, usually by plating.

In order to achieve conductivity and a consistent, reliable bond between the electroplated metal (usually copper), and the through holes, the through holes are usually first provided with a layer of electroless copper in a process which requires several steps, including pre-activation, activation with a palladium/tin activator, application of an accelerator, electroless copper deposition and one or more rinses, before electroplating could be effected. The need for application of electroless copper can be avoided, it has been found, by the deposition of carbon on the through holes or other non-conductive surface which is to be electroplated. In this way, the long process time, complex chemistry requiting constant monitoring, and sensitivity of electroless baths can be avoided. Moreover, the expensive waste treatment often required with electroless copper and palladium/tin activators can be eliminated.

However, the use of a carbon deposition process may have several drawbacks. After carbon deposition, it takes several minutes before the non-conductive surface being plated is completely covered by the electroplated metal. This is especially significant where the surface to be plated is a through hole. Electroplating after treatment with carbon begins adjacent to the outer conductive surfaces (i.e., the copper foil) of the PCB and extends inward towards the center of the hole. This occurs from both sides of the through hole and the plating meets in the center and completes the connection. In addition, it is sometimes difficult to achieve complete coverage and acceptable plating particularly in small, high aspect ratio holes. Finally, possibly, because of the resistance of the carbon layers, it can be difficult or impossible to plate large areas of non-conductive surfaces, as are required in general plating on plastics.

This "bridging" of the hole is a slow process and provides unwanted opportunities for defects in the metal plate, such as voids. In addition, because of the time it takes for "bridging" to occur after carbon deposition, carrying out the process in a conveyorized manner can be commercially impractical, and hampers the ability to add a conveyorized electrolytic copper flash immediately after carbon treatment.

Prior to the development of electroless methods of plating through holes, it was suggested to use graphite to prepare the walls of the through holes prior to plating. Radovsky et al. in U.S. Pat. No. 3,099,608, teaches a process for preparing the through hole walls of a printed circuit board by initially depositing a thin electrically non-conductive film of palladium metal in at least a semi-colloidal form in the through holes. It is indicated by Radovsky et al. that graphite had been used previously as a conductive base layer for electroplating (see col. 1, lines 63–70, and col. 4, line 72—col. 5, line 11). It is noted by Radovsky et al. that there are several defects with the prior art graphite process including lack of control of the graphite application, poor deposit of the resultant electroplated metal, non-uniform through hole diameters, and low electrical resistance of the graphite. It is also mentioned by Shortt et al. U.S. Pat. No. 3,163,588 that graphite (or equivalents of graphite) may be employed to render through hole walls of electric circuit boards conductive for later electroplating metals thereon. Graphite has also been employed in numerous other types of processes for preparing a non-conducting material for a metal coating or plating. For instance, U.S. Pat. No. 409,096 to Alois Blank teaches a process for applying copper to asbestos roofing material. The process involves applying a powdered plumbago (graphite) in a volatile liquid such as varnish to the surface of the asbestos, then evaporating the volatile liquid to coat the asbestos fibers with particles of plumbago. The graphite coated asbestos sheets are then immersed in a copper solution and electric current is applied to form a thin film of copper on the sheets. The copper coated sheet is then immersed in a bath of molten metal such as tin, lead, or zinc, and is removed from the molten bath to effect solidification. The resulting metal coated asbestos sheet is described as being relatively flexible, a non-conductor of heat and substantially fireproof.

In U.S. Pat. No. 1,037,469 to Goldberg and U.S. Pat. No. 1,352,331 to Unno, processes for electroplating non-conducting materials are described, which involve coating the material with wax and then a slurry of particles of graphite or other metal, followed by electroplating of the coated surface with copper or other metal. Neither of these processes are particularly suitable for use in coating the hole walls of circuit boards because the holes are normally extremely narrow in diameter and immersing in wax would tend to plug the hole and prevent coating the through hole walls with an electroplating material.

A process which involves "graphiting" a thin layer onto the non-conducting surface followed by applying a copper layer electrolytically and "finally a further electrolytic deposit of another metal" is disclosed by Laux in U.S. Pat. No. 2,243,429.

The first practical teaching of a carbon black deposition system, which permits the elimination of electroless copper deposition prior to electroplating, was by Minten and Pismennaya in U.S. Pat. No. 4,724,005, the disclosure of which is incorporated herein by reference in its entirety. Although the carbon black process they disclose is effective, the long "bridging" time (ie. the time necessary to fully connect both sides of the hole with the plated metal or to achieve substantial coverage) created is not recognized, nor any solution proposed. A long line of patents have issued concerning improvements to or variations in the process described in U.S. Pat. No. 4,724,005 including U.S. Pat. No. 5, 139,642 to Randolph et al., the teachings of which are incorporated herein by reference in their entirety, but none of them address or relate to the invention at hand.

Current carbon based plating processes require a microetch step after the carbon application in order to remove the carbon from the copper surfaces of printed circuit boards (eg. circuitry and inner layer connections) so as to insure good copper to copper adhesion with the subsequent plating. However, microetching frequently causes problems, particularly in plating in the area of the copper-dielectric interface. In particular, etching the copper frequently also strips the carbon coating from the dielectric area directly adjacent to the copper, thereby creating an insulating barrier for electrical continuity in the subsequent electroplating. This barrier then leads to poor plating and defects such as voids, knit lines, and plating folds. The prior art requirement for microetching prior to electroplating in carbon-based processes is detailed in U.S. Pat. No. 4,964,959 (Column 10, lines 5–60), the entire teachings of which are incorporated herein by reference. U.S. Pat. No. 4,964,959 describes the use of a microetch to "flake off" the carbon on the copper surfaces.

What is desired is a carbon treatment process which is effective for promoting the electroplating of a non-conductive surface, while reducing the defects associated with the previously required microetching.

SUMMARY OF THE INVENTION

It is an object of the invention to present a process for electroplating non-conductive surfaces. It is another object of the invention to present a process for metallizing the through holes of a printed circuit board. It is still another object of the invention to present a process for electroplating a non-conductive surface while enhancing the speed of the electroplating operation and the ultimate coverage achieved. Finally, it is an object of the present invention to present an improved process for electroplating non-conductive surfaces by the elimination of the need for deposition of electroless copper by use of a dispersion of carbon (the use of the word, "carbon" in this application shall be taken to mean carbon black, graphite or any intermediate structures of carbon), while eliminating the need for a microetching step and the problems associated therewith.

These objects, as well as others which will become apparent to the skilled worker, are obtained by the practice of this process for enhancing the electroplating of a surface comprising non-conductive surfaces and metallic (conductive) surfaces disclosed herein, which includes the steps of treating the surfaces with a compound which reacts or adheres to the metallic surfaces (ie. creating a sacraficial layer on the metallic surfaces) without substantially reacting or adhering to the non-conductive surfaces (ie. no sacraficial layer on the non-conductive surfaces), which compound is substantially not soluble in alkaline or neutral solutions but is soluble in acidic solutions; treating the surfaces with a liquid dispersion which comprises carbon particles, removing at least about ninety (90%) percent of the liquid dispersing medium to deposit the carbon particles on surfaces in a substantially continuous manner; treatment of the now carbon coated surfaces in an acid solution thereby removing the sacraficial layer and the carbon from the metallic surfaces substantially without affecting the carbon on the non-conductive surfaces; and electroplating a substantially continuous conductive metal layer over the deposited carbon and the non-conductive surface.

DETAILED DESCRIPTION OF THE INVENTION

As noted above, a preferred embodiment of the present invention relates to the preparation of a PCB through hole for the deposition of an electroplated layer of copper or other conductive metal (such as nickel, gold, shaver, etc.) so as to form a connection between conductive metal layers which are sandwiched with non-conductive layers. Although this description will be written in terms of electroplating (or metalizing) the through holes of printed circuit boards, it will be understood that such is for ease of description only, and that the disclosed process is equally applicable to the preparation of various non-conductive surfaces for deposition of an electroplated metal layer on plastics applications.

Printed circuit boards are generally comprised of two or more plates or foils of nickel or copper, which are separated from each other by a layer of non-conducting material. The non-conducting layers are typically comprised of an organic material such as an epoxy resin which has been reinforced with glass fiber.

Alternatively, the non-conducting layer may also be comprised of thermosetting resins, thermoplastic resins, and mixtures thereof, with or without reinforcing materials such as fiberglass and fillers.

Suitable thermoplastic resins include the acetyl resins; acrylics, such as methyl acrylate; cellulosic resins, such as ethyl cellulose, cellulose acetate, cellulose propionate, cellulose acetate butyrate, cellulose nitrate, and the like; chlorinated polyethers; nylon, polyethylene; polypropylene, polystyrene, styrene blends, such as acrylonitrile styrene co-polymers; polycarbonates; polychlorotrifluorethylene; and vinyl polymers and co-polymers, such as vinyl acetate, vinyl alcohol, vinyl butyral, vinyl chloride, vinyl chloride-acetate co-polymer, vinylidene chloride and vinyl formal.

Suitable thermosetting resins include alkyl phthalate; furane; melamine-formaldehyde; phenol formaldehyde and phenol-furfural co-polymer, alone or compounded with butadiene acrylonitrile co-polymers; polyacrylic esters; silicones; urea formaldehydes; epoxy resins, polyimides, alkyl resins, glycerol phthalates; polyesters; and the like.

Through holes are formed in primed circuit boards in order to establish connection between the metal plates at certain points in the board to produce the desired electrical pattern. This is usually accomplished by drilling holes at the desired locations through the copper plates and the non-conducting layers, and then connecting the separate metal plates by metallizing the through holes (i.e., coating the inner surface of the through hole with a conductive metal). The hole diameters of PCBs generally range from about 0.15 millimeters to about 10.0 millimeters, more typically from about 0.3 millimeters to about 1.0 millimeters.

In order to make the walls of the through holes relatively smooth, if desired, it may be necessary to deburr the holes. In the case of multilayer printed circuit boards, it may also be desirable to subject the boards to a desmear or etchback operation to clean the inner copper interfacing surfaces of the through holes. The present invention includes any such suitable preparative operations.

Prior to the application of the carbon, the surfaces, comprising copper surfaces and non-conductive surfaces, are treated with a compound or compounds which react or adhere to the copper surfaces (ie. circuitry and inner-layer connections) substantially without reacting with or adhering to the non-conductive portions of the surfaces (ie. the dielectric). The compound should form a sacrificial layer on the copper (metallic) surfaces which layer is soluble in acid solutions but is substantially without solubility in alkaline solutions.

Examples of compounds which are useful in this regard are imidazoles, benzimidazoles and tetrazoles, however, any compound or combination of compounds, which form a sacrificial layer substantially selectively on the metallic surfaces (eg. copper surfaces in the case of printed circuitboards) which sacrificial layer is soluble in acid but substantially insoluble in alkaline media (such as typical cleaner/conditioners and the carbon dispersion), will perform acceptably in the process of this invention. The inventors have found dialkylimidazoles to be particularly useful herein. Preferably the compound is in aqueous solution with pH adjusters to optimize the pH of the solution. Most preferably the pH of the solution is between 2 and 5. The inventors have found imidazoles to be particularly useful and preferred in the process of this invention. The concentration of the compound in solution may range from 0.1 gr/l to saturation but is preferably between 5 and 10 grams per liter. The time and temperature of application may vary depending upon the compound, its concentration and method of application.

The sacrificial layer is typically formed by immersing the part into the solution containing the compound or spraying said solution onto the part. The part is then rinsed and proceeds through the typical cleaner conditioner and into the carbon dispersion.

Advantageously, the printed circuit board is precleaned in order to place it in condition for receiving the liquid carbon black dispersion of this invention. In one preferred precleaning operation, the PCB is placed in a cleaner/conditioner bath for several minutes at a temperature of about 130° F. to remove grease and other impurities from the hole wall surfaces. One preferred Cleaner/Conditioner, Blackhole SP Conditioner, is sold by MacDermid Incorporated of Waterbury, Conn. After the application of the cleaner/conditioner, the printed circuit board is rinsed to remove any residual cleaner/conditioner from the board. Advantageously, the cleaner/conditioner should be alkaline so as not to remove the sacrificial layer. It should be recognized that none of the above-mentioned hole drilling or pre-cleaning operations is a critical feature of the present invention. Any and all conventional equivalents to these operations may be used instead.

Typically, the carbon deposition process involves the application of a liquid carbon dispersion to the cleaned printed circuit board. This dispersion contains three principal ingredients, namely carbon, one or more surfactants capable of dispersing the carbon, and a liquid dispersing medium such as water. The preferred methods of applying the dispersion to the PCB include immersion, spraying or other methods of applying chemicals used in the printed circuit board industry. A single working bath is sufficient for applying this carbon black dispersion; however, more than one bath may be used for rework or other purposes.

In preparing the liquid carbon dispersion, the three primary ingredients, and any other preferred ingredients, are mixed together to form a stable dispersion. This may be accomplished by subjecting a concentrated form of the dispersion to ball milling, colloidal milling, high-shear milling, ultrasonic techniques or other like procedures to thoroughly mix the ingredients. The dispersion can then be later diluted with more water to the desired concentration for the working bath. The preferred method of mixing is ball milling a concentrated form of the dispersion in a container having glass mineral or plastic beads therein for at least about 1 hour. The mixing can continue for up to about 24 hours. This thorough mixing allows for the carbon particles to be intimately coated or wetted with the suffactant. The mixed concentrate is then mixed with water or some other liquid dispersing medium to the desired concentration. The working bath is preferably kept agitated during both the diluting and applying steps to aid in maintaining dispersion stability.

The particle diameter of the carbon particles should average no more than about 3 microns while in the dispersion. It is desirable to have this average particle diameter of carbon as small as possible to obtain desired plating characteristics, such as substantially even plating and no plating pullaways. The average particle diameter of the carbon particles is preferably from about 0.05 microns to about 3.0 microns, more preferably between about 0.08 microns and about 1.0 microns when in the dispersion. The term "average particle diameter" as used herein refers to the average mean diameter of the particles (the average by number). The average mean diameter in the dispersion may be determined through the use of either a NiComp Model 370 submicron particle sizer (Version 3.0) or a HIAC PA-720 automatic particle size analyzer (both available from the HIAC/ROYCO Instrument Division of Pacific Scientific of Menlo Park, Calif.). It is also important to maintain the size distribution of the carbon particles to a relatively narrow distribution.

Many types of carbon may be used for this invention including the commonly available carbon blacks, furnace blacks, and suitable small particle graphites. However, it is preferred to utilize carbon blacks which are initially acidic or neutral, i.e. those which have a pH of between about 1 and about 7.5 and more preferably between about 2 and about 4 when slurried with water. The carbon black particles which are preferred are also very porous and generally have as their surface area from about 45 to about 1100, and preferably about 300 to about 600, square meters per gram, as measured by the BET method (method of Brunauer-Emmert-Teller).

Among the commercially available carbon blacks suitable for use in this invention are Cabot XC-72R Conductive, Cabot Monarch 800, Cabot Monarch 1300, all available from Cabot Corporation of Boston, Mass. Other suitable carbon blacks include Columbian T-10189, Columbian Conductiex 975 Conductive, Columbian CC-40,220, and Columbian Raven 3500, all available from Columbian Carbon Company of New York, N.Y. Cabot Monarch 1300 and Columbian Raven 3500 are the two most preferred carbon blacks because of their ease of dispersion and low pH. Suitable graphites include Showa-Denko UFG available from Showa-Denko K.K., 13-9 Shiba Daimon 1-Chrome, Minato-Ku, Tokyo, 105 Japan, Nippon Graphite AUP available from Nippon Graphite Industries, Ishiyama, Japan, and Asbury Micro 850, available from Asbury Graphite Mills of Asbury, N.J.

In addition to water and carbon a surfactant capable of dispersing the carbon in the liquid dispersing medium is employed in the dispersion. One or more surfactants is added to the dispersion to enhance the wetting ability and stability of the carbon and to permit maximum penetration by the carbon within the pores and fibers of the non-conducting layer of the PCB. Suitable surfactants include anionic, nonionic and cationic surfactants (or combinations thereof such as amphoteric surfactants). The surfactant should be soluble, stable and preferably non-foaming in the liquid carbon dispersion. In general, for a polar continuous phase as in water, the surfactant should preferably have a high HLB number (8–18).

The preferred type of surfactant will depend mainly on the pH of the dispersion. Preferably the total dispersion is alkaline (i.e. has an overall pH in the basic range) so as not to disturb the sacraficial layer. In this case, it is preferred to employ an anionic or nonionic suffactant. Acceptable anionic surfactants include sodium or potassium salts of naphthalene sulfonic acid such as DARVAN No. 1, commercially available from Eastern Color and Chemical, PETRO AA and PETRO ULF, commercially available from Petro Chemical Co., Inc., and AEROSOL OT, commercially available from American Cyanamid. Preferred anionic surfactants include neutralized phosphate ester-type surfactants such as MAPHOS 55,56,8135, 60A and L6, commercially available from Mazer Chemical Co. The most preferable anionic surfactant for a liquid carbon black dispersion is MAPHOS 56. Suitable nonionic surfactants include ethoxylated nonyl phenols such as the POLY-TERGENT B-series from Olin Corporation or alkozylated linear alcohol's such as the POLY-TERGENT SL-series, also from Olin Corporation.

Advantageously, carbon is present in the dispersion in an mount of less than about 15% by weight of the dispersion, preferably less than about 5% by weight, most preferably weight, most preferably less than 2% by weight, particularly when the form of carbon is carbon black. It has been found that the use of higher concentrations of carbon blacks may provide undesirable plating characteristics. In the same regard, the solids content (i.e. all of the ingredients other than the liquid dispersing medium) is preferably less than about 10% by weight of the dispersion, more preferably, less than about 6% by weight.

The liquid dispersion of carbon is typically placed in a vessel and the printed circuit board is immersed in, sprayed with or otherwise contacted with the liquid dispersion. The temperature of the liquid dispersion in an immersion bath should be maintained at between about 15° C. and about 35° C. and preferably between about 20° C. and about 30° C. during immersion. The period of immersion advantageously ranges from about 15 seconds to about 10 minutes, more preferably from about 30 seconds to 5 minutes.

The immersed board is then removed from the bath of the liquid carbon-containing dispersion and is preferably contacted with compressed air to unplug any through holes that may still retain plugs of the dispersion. In addition, excess basic liquid carbon-containing dispersion is removed from the face of the copper plates.

Next, substantially all (i.e. over about 90% by weight) of the water (or other liquid dispersing medium) in the applied dispersion is removed and a dried deposit containing carbon is left on the surfaces of the non-conducting material. This may be accomplished by several methods such as by evaporation at room temperature, by a vacuum, or by heating the board for a short time at an elevated temperature. Heating at an elevated temperature is the preferred method. Heating is generally carried out for between about 5 and about 45 minutes at a temperature of from about 75° C. to about 120° C., more preferably from about 80° to 98° C. To insure complete coverage of the hole walls, the procedure of immersing the board in the liquid carbon dispersion and then drying may be repeated one or more times.

The resulting PCB is often completely coated with the carbon dispersion. The dispersion is not only coated on the drilled hole surfaces, as desired, but also coats the copper plate or foil surfaces, which is disadvantageous. Thus prior to any further processing, the carbon should be removed from the copper plate or foil surface.

After the carbon dispersion has been dried on the part, the part is dipped in a mild acid solution in order to remove the unwanted carbon from the metallic (copper) surfaces. Typically the acid solution has a pH between 0 and 6, preferably between 1 and 5. A variety of acids including hydrochloric acid, sulfuric acid, acetic acid, citric acid, tartaric acid and the like may be used. The concentration of the acid may range from 0.5% to 50% by weight, preferably from 1% to 10% by weight, with water essentially making up the remainder. The time and temperature of application may vary depending upon the particular acid, pH and the method of application. Application of the acid solution can be by any conventional means such as by immersion or spray. After removal of the unwanted carbon from the metallic surfaces, the parts are ready for the standard electroplating process as subsequently indicated. Optionally, a standard soak cleaner, as is typically used in electroplating processes, may be employed at this point prior to electroplating.

The thusly treated printed wiring board is then immersed in a suitable electroplating bath for applying a copper coating on the hole walls of the non-conducting layer. The present invention contemplates the use of any and all electroplating operations conventionally employed in applying a metal layer to the through hole walls of a PCB. Therefore this claimed invention is not limited to any particular electroplating bath parameters.

A typical copper electroplating bath is comprised of copper, copper sulfate, $H_2SO_4$ and chloride ion in aqueous solution. The electroplating bath is normally agitated and preferably maintained at a temperature of between about 20° C. and about 25° C. The electroplating bath is provided with anodes, generally constructed of copper, and the printed circuit board to the plated is connected as a cathode to the electroplating circuit. A current is then impressed across the electroplating circuit for a period of between about 60 and about 90 minutes in order to effect copper plating on the hole walls of the non-conducting layer positioned between the two plates of copper. This copper plating of the hole wall provides a current path between the copper layers of the printed circuit board. Other suitable electroplating conditions may be employed, if desired. Other electroplating bath compositions containing other copper salts or other metal salts such as salts of nickel, gold, silver and the like may be employed, if desired.

The printed circuit board is removed from the copper electroplating bath and then washed and dried to provide a board which is further processed by applying photoresist compounds and the like, as is known in the art for the preparation of printed circuit boards.

The invention is further illustrated with reference to the following examples which should not be taken as limiting.

EXAMPLE I

A multilayer printed circuit board with through-holes is processed according to the following sequence:

1. Immersion in an aqueous solution of 2,5 nonyl imidazole at 6 gr/l and a pH of 4.4 adjusted with acetic acid for 1 minute at 95° F.
2. Rinse
3. MacDermid Blackhole® SP Conditioner, 5 minutes, 130° F.
4. Rinse
5. MacDermid Blackhole® SP Solution, 90 seconds, 90° F.
6. Forced air dry
7. Heated dry, 85° C., 1 minute
8. Immersion in an aqueous solution of hydrochloric acid at 100° F. for 1 minute
9. Rinse 10. Copper electroplating to a thickness of 1.0 mil.

It is noted that in step 8 above, the carbon from the Blackhole® SP solution is removed from the copper surfaces but remains in tact on the dielectric surfaces.

After processing, the boards, and the holes and interconnections therein, are examined visually, by standard cross-section and microscopic analysis, and by standard solder shock testing by immersion in molten solder at 550°F. for 10 seconds. Visual examination reveals no flaws and indicates that the copper plate is smooth and has good adherence to the underlying copper metal. Cross sectioning and microscopic analysis reveals that the interconnections are in tact and that the hole plated with a smooth, uniformly thick layer of copper. Solder shock testing reveals no blistering, pull-away or interconnection defects.

EXAMPLE II (COMPARATIVE)

A multilayer primed circuit board with through-holes is processed according to the following sequence:

1. MacDermid, Blackhole® SP Conditioner, 60 seconds, 130° F.
2. Rinse
3. MacDermid Blackhole®SP solution, 90 seconds, 90° F.
4. Forced air dry
5. Heated dry, 85° C., 1 minute
6. Peroxide/Sulfuric Microetch (5% by weight hydrogen peroxide, 100 gr/l sulfuric acid), 110° F., 90 seconds
7. Rinse
8. Copper electroplating to a thickness of 1.0 mil.

After processing, the boards, and the holes and interconnections therein are examined visually, by standard cross-section and microscopic analysis, and by standard solder shock testing by immersion in molten solder at 550° F. for 10 seconds. Visual examination reveals no flaws and indicates that the copper plate is smooth on the surface circuitry and has good adherence to the underlying copper metal. However, cross sectioning and microscopic analysis reveals that the thickness of the plate in the holes is substantially uneven, with substantially thicker plate near the surfaces of the holes and thinner plate towards the center of the holes. In addition, microscopic analysis of the hole cross-sections reveals knit lines around the upper and lower edge of each inner-layer. Solder shock testing reveals no blistering, pull-away or interconnection defects (other than as noted above).

What is claimed is:

1. A process for electroplating a conductive metal layer onto a substrate, said substrate comprising non-conductive surfaces and metallic surfaces, said process comprising:

(a) contacting said substrate with a solution comprising a compound which forms a sacrificial layer on the metallic surfaces substantially without forming the sacrificial layer on the non-conductive surfaces, which sacrificial layer is substantially insoluble in neutral or alkaline media but substantially soluble in acid media; thereafter (b) contacting said substrate with a liquid carbon dispersion to deposit a layer of carbon onto the substrate; thereafter (c) contacting said substrate with an acidic solution to solubilize the sacrificial layer; and thereafter (d) electroplating a conductive metal layer over at least the non-conductive surfaces.

2. A process according to claim 1 wherein the substrate is a copper laminate with holes.

3. A process according to claim 2 wherein the compound comprises a dialkylimidazole.

4. A process according to claim 2 wherein the compound is selected from the group consisting of imidazoles, benzimidazoles and triazoles.

5. A process according to claim 1 wherein the compound is selected from the group consisting of imidazoles, benzimidazoles, and triazoles.

6. A process according to claim 5 wherein the compound comprises a dialkylimidazole.

7. A process according to claim 6 wherein the liquid carbon dispersion comprises carbon black.

8. A process according to claim 7 wherein the acidic solution comprises hydrochloric acid.

9. A process according to claim 1 wherein the substrate is a printed circuit board.

10. A process according to claim 9 wherein the compound is selected from the group consisting of imidazoles, benzimidazoles, and triazoles.

11. A process according to claim 10 wherein the liquid carbon dispersion comprises carbon black.

12. A process according to claim 8 wherein the acidic solution comprises hydrochloric acid.

13. A process according to claim 1 wherein the liquid carbon dispersion comprises carbon black.

14. A process according to claim 1 wherein the metallic surfaces comprises copper.

15. A process according to claim 1 wherein the acidic solution comprises hydrochloric acid.

16. A process according to claim 1 wherein the compound comprises a dialkylimidazole.

* * * * *